United States Patent
Porter et al.

(10) Patent No.: US 7,963,118 B2
(45) Date of Patent: Jun. 21, 2011

(54) VAPOR-COMPRESSION HEAT EXCHANGE SYSTEM WITH EVAPORATOR COIL MOUNTED TO OUTLET DOOR OF AN ELECTRONICS RACK

(75) Inventors: Donald W. Porter, Highland, NY (US); Roger R. Schmidt, Poughkeepsie, NY (US); Jyunji Takayoshi, Fujisawa (JP); Takeshi Tsukamoto, Hachiohji (JP); Yasuharu Yamada, Higashiohmi (JP)

(73) Assignee: International Business Machines Corporation, Armonk, NY (US)

( * ) Notice: Subject to any disclaimer, the term of this patent is extended or adjusted under 35 U.S.C. 154(b) by 938 days.

(21) Appl. No.: 11/860,634

(22) Filed: Sep. 25, 2007

(65) Prior Publication Data

US 2009/0080173 A1 Mar. 26, 2009

(51) Int. Cl.
- *F25D 23/12* (2006.01)
- *F25D 19/00* (2006.01)
- *H05K 7/20* (2006.01)
- *H05K 5/00* (2006.01)

(52) U.S. Cl. .......... 62/259.2; 62/449; 361/696; 454/184
(58) Field of Classification Search ............. 62/259.2, 62/449; 361/696; 454/184
See application file for complete search history.

(56) References Cited

U.S. PATENT DOCUMENTS

| | | | |
|---|---|---|---|
| 4,011,905 A | 3/1977 | Millard | |
| 5,187,950 A * | 2/1993 | Weldon | 62/449 |
| 5,467,250 A | 11/1995 | Howard et al. | |
| 6,164,369 A | 12/2000 | Stoller | |
| 6,462,944 B1 | 10/2002 | Lin | |
| 6,535,382 B2 | 3/2003 | Bishop et al. | |
| 6,760,221 B2 | 7/2004 | Goth et al. | |
| 6,775,137 B2 | 8/2004 | Chu et al. | |
| 7,074,123 B2 | 7/2006 | Bettridge et al. | |
| 7,086,247 B2 | 8/2006 | Campbell et al. | |
| 7,385,810 B2 * | 6/2008 | Chu et al. | 361/679.48 |
| 7,403,391 B2 | 7/2008 | Germagian et al. | |
| 7,676,909 B2 * | 3/2010 | MacKenzie et al. | 29/797 |
| 7,830,657 B2 | 11/2010 | Chu et al. | |
| 2004/0177948 A1 | 9/2004 | Cho et al. | |
| 2005/0231913 A1 | 10/2005 | Malone et al. | |
| 2005/0243514 A1 | 11/2005 | Malone et al. | |
| 2006/0141921 A1 | 6/2006 | Turek et al. | |

(Continued)

OTHER PUBLICATIONS

"RackCooler"—A Cool Solution for X-Treme Density Rack Enclosure Systems, Liebert Corporation, Product Brochure, 8 pgs. (2001).

(Continued)

*Primary Examiner* — Marc E Norman
(74) *Attorney, Agent, or Firm* — Dennis Jung, Esq.; Kevin P. Radigan, Esq.; Heslin Rothenberg Farley & Mesiti P.C.

(57) ABSTRACT

A vapor-compression heat exchange system for facilitating cooling of an electronics rack. The system includes employing an evaporator coil mounted to an outlet door cover, which is hingedly affixed to an air outlet side of the rack, as well as refrigerant inlet and outlet plenums and an expansion valve also mounted to the outlet door cover and in fluid communication with the evaporator coil. The evaporator coil includes at least one heat exchange tube section and a plurality of fins extending therefrom. Respective connect couplings connect the inlet and outlet plenums in fluid communication with a vapor-compression unit which includes a compressor and a condenser disposed separate from the outlet door cover. The vapor-compression unit exhausts heat from refrigerant circulating therethrough.

20 Claims, 11 Drawing Sheets

U.S. PATENT DOCUMENTS

2006/0232945 A1 10/2006 Chu et al.
2008/0068798 A1* 3/2008 Hendrix et al. ............... 361/696

OTHER PUBLICATIONS

Teague, Paul E., "One Cool Machine", Design News for Mechanical and Design Engineers, Internet Article, 6 pgs. (Feb. 7, 2005).
Office Action for U.S. Appl. No. 11/108,306 (U.S. Letters Patent No. 7,385,810 B2), dated Sep. 20, 2007.

* cited by examiner

VAPOR-COMPRESSION HEAT EXCHANGE SYSTEM WITH EVAPORATOR COIL MOUNTED TO OUTLET DOOR OF AN ELECTRONICS RACK

CROSS-REFERENCE TO RELATED APPLICATION

This application contains subject matter which is related to the subject matter of the following application, which is assigned to the same assignee as this application. The below listed application is hereby incorporated herein by reference in its entirety:

"Apparatus and Method for Facilitating Cooling of an Electronics Rack Employing a Heat Exchange Assembly Mounted to an Outlet Door Cover of the Electronics Rack," Chu et al., U.S. Ser. No. 11/108,306, filed Apr. 18, 2005, and published on Oct. 19, 2006 as U.S. Patent Application Publication No. U.S. 2006/0232945 A1.

TECHNICAL FIELD

The present invention relates in general to apparatuses and methods for facilitating cooling of rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (e.g., data center).

The sensible heat load carried by the air exiting the rack is stressing the ability of the room air conditioning to effectively handle the load. This is especially true for large installations with "server farms" or large banks of computer racks close together. In such installations not only will the room air conditioning be challenged, but the situation may also result in re-circulation problems with some fraction of the "hot" air exiting one rack unit being drawn into the air inlet of the same rack or a nearby rack. This re-circulating flow is often extremely complex in nature, and can lead to significantly higher rack inlet temperatures than expected. This increase in cooling air temperature may result in components exceeding their allowable operating temperature or in a reduction in long term reliability of the components.

SUMMARY OF THE INVENTION

The shortcomings of the prior art are overcome and additional advantages are provided through provision of an apparatus for facilitating cooling of an electronics rack. The apparatus includes a vapor-compression heat exchange system mounted in part to an outlet door cover of an electronics rack. Air moves through the electronics rack from an air inlet side to an air outlet side thereof, and the outlet door cover is configured to hingedly mount along one edge to the electronics rack at the air outlet side of the rack. The vapor-compression heat exchange system includes: an evaporator coil; a refrigerant inlet plenum and a refrigerant outlet plenum; an expansion value; and a vapor-compression unit. The evaporator coil is mounted to the outlet door cover and covers at least a portion of an opening in the outlet door cover. The refrigerant inlet and outlet plenums are disposed adjacent to the edge of the outlet door cover configured to hingedly mount to the electronics rack, and are each in fluid communication with a respective connect coupling of the vapor-compression heat exchange assembly. The evaporator coil includes at least one heat exchange tube section and a plurality of fins extending from the at least one heat exchange tube section. The refrigerant inlet plenum and refrigerant outlet plenum are each in fluid communication with the at least one heat exchange tube section. The expansion valve is in fluid communication with the refrigerant inlet plenum and is also mounted to the outlet door cover. The vapor-compression unit includes a compressor and a condenser disposed separate from the outlet door cover. The vapor-compression unit is in fluid communication, via the respective connect couplings, with the refrigerant inlet plenum, expansion valve, evaporator coil and refrigerant outlet plenum mounted to the outlet door cover, and exhausts heat from refrigerant circulating therethrough.

In another aspect, a cooled electronics system is provided which includes an electronics rack and an apparatus for facilitating cooling of the electronics rack. The electronics rack includes: an air inlet side and an air outlet side, the air inlet and air outlet sides respectively enabling ingress and egress of external air; at least one electronics subsystem requiring cooling; at least one air-moving device, the at least one air-moving device being capable of causing external air to flow from the air inlet side of the electronics rack, across the at least one electronics subsystem to the air outlet side of the electronics rack; and an outlet door cover hingedly mounted along one edge to the electronics rack at the air outlet side of the electronics rack, the outlet door cover having an opening therein allowing air to egress from the electronics rack. The apparatus includes a vapor-compression heat exchange system mounted in part to the outlet door cover of the electronics rack. The vapor-compression heat exchange system includes: an evaporator coil; a refrigerant inlet plenum and a refrigerant outlet plenum; an expansion valve; and a vapor-compression unit. The evaporator coil is mounted to the outlet door cover and covers at least a portion of the opening in the outlet door cover. The refrigerant inlet and outlet plenums are disposed adjacent to the edge of the outlet door cover hingedly mounted to the electronics rack, and are each in fluid communication with the respective connect coupling of the vapor-compression heat exchange system. The evaporator coil includes at least one heat exchange tube section and a plurality of fins extending from the at least one heat exchange tube section, with the inlet and outlet plenums being in fluid communication with the at least one heat exchange tube section. The expansion valve is in fluid communication with the refrigerant inlet plenum and is mounted to the outlet door cover. The vapor-compression unit includes a compressor and a condenser disposed separate from the outlet door cover. The vapor compression unit is in fluid communication with the refrigerant inlet plenum, expansion valve, evaporator coil and refrigerant outlet plenum mounted to the outlet door cover for exhausting heat from the refrigerant circulating therethrough.

In a further aspect, a data center is provided which includes at least one electronics rack and a vapor-compression heat exchange system for cooling the at least one electronics rack. Each electronics rack includes an air inlet side and an air outlet side, which respectively enable ingress and egress of air through the electronics rack, and an outlet door cover hingedly mounted along one edge to the electronics rack at the air outlet side thereof. The vapor-compression heat exchange system includes for each electronics rack of the at least one electronics rack: an evaporator coil, a refrigerant inlet plenum and a refrigerant outlet plenum, and an expansion valve. The evaporator coil is mounted to the outlet door cover of the respective electronics rack and covers at least a portion of an opening therein. The refrigerant inlet plenum and refrigerant outlet plenum are disposed adjacent to the edge of the outlet door cover hingedly mounted to the electronics rack. The inlet and outlet plenums are each in fluid communication with respective connect couplings of the vapor-compression heat exchange system. The evaporator coil includes at least one heat exchange tube section and a plurality of fins extending there from. The refrigerant inlet and outlet plenums are each in fluid communication with the at least one heat exchange tube section. The expansion valve is in fluid communication with the refrigerant inlet plenum and is also mounted to the inlet door cover. The vapor-compression heat exchange system further includes a vapor compression unit disposed separate from the at least one outlet door cover of the at least one electronics rack. This vapor-compression unit includes a compressor and a condenser which are in fluid communication with the refrigerant inlet plenum, expansion valve, evaporator coil, an outlet plenum mounted to each outlet door cover of the at least one electronics rack for exhausting heat from refrigerant circulating therethrough.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, the terms "electronics rack", "rack-mounted electronic equipment", and "rack unit" are used interchangeably, and include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems or drawers each having one or more heat generating components disposed therein requiring cooling. "Electronics subsystem" refers to any sub-housing, blade, book, drawer, node, compartment, etc., having one or more heat generating electronics components disposed therein. Electronics subsystems of an electronics rack may be movable or fixed relative to the electronics rack, with the rack-mounted electronics drawers and blades of a blade center system being two examples of subsystems of an electronics rack to be cooled.

"Vapor-compression heat exchange system" means any heat exchange mechanism characterized as described herein through which refrigerant can circulate; and includes, one or more discrete air-to-liquid evaporator coils coupled either in series or in parallel. An evaporator coil may comprise, for example, one or more coolant flow paths, formed of thermally conductive tubing (such as copper or other tubing) in thermal or mechanical contact with a plurality of air cooled cooling fins. Size, configuration and construction of components of the vapor-compression heat exchange system described herein can vary without departing from the scope of the present invention. Further, "data center" refers to a computer installation containing one or more electronics racks to be cooled. As a specific example, a data center may include one or more rows of rack-mounted computing units, such as server units.

One example of refrigerant which may be used in a vapor-compression heat exchange system such as described herein is a hydrofluorocarbon such as HFC R410a. However, the concepts disclosed herein are readily adapted to use with other types of refrigerant, while still maintaining the advantages and unique features of the present invention.

Reference is made below to the drawings, which are not drawn to scale and are simplified for ease of understanding, wherein the same reference numbers used throughout different figures designate the same or similar components.

Figure 1A:
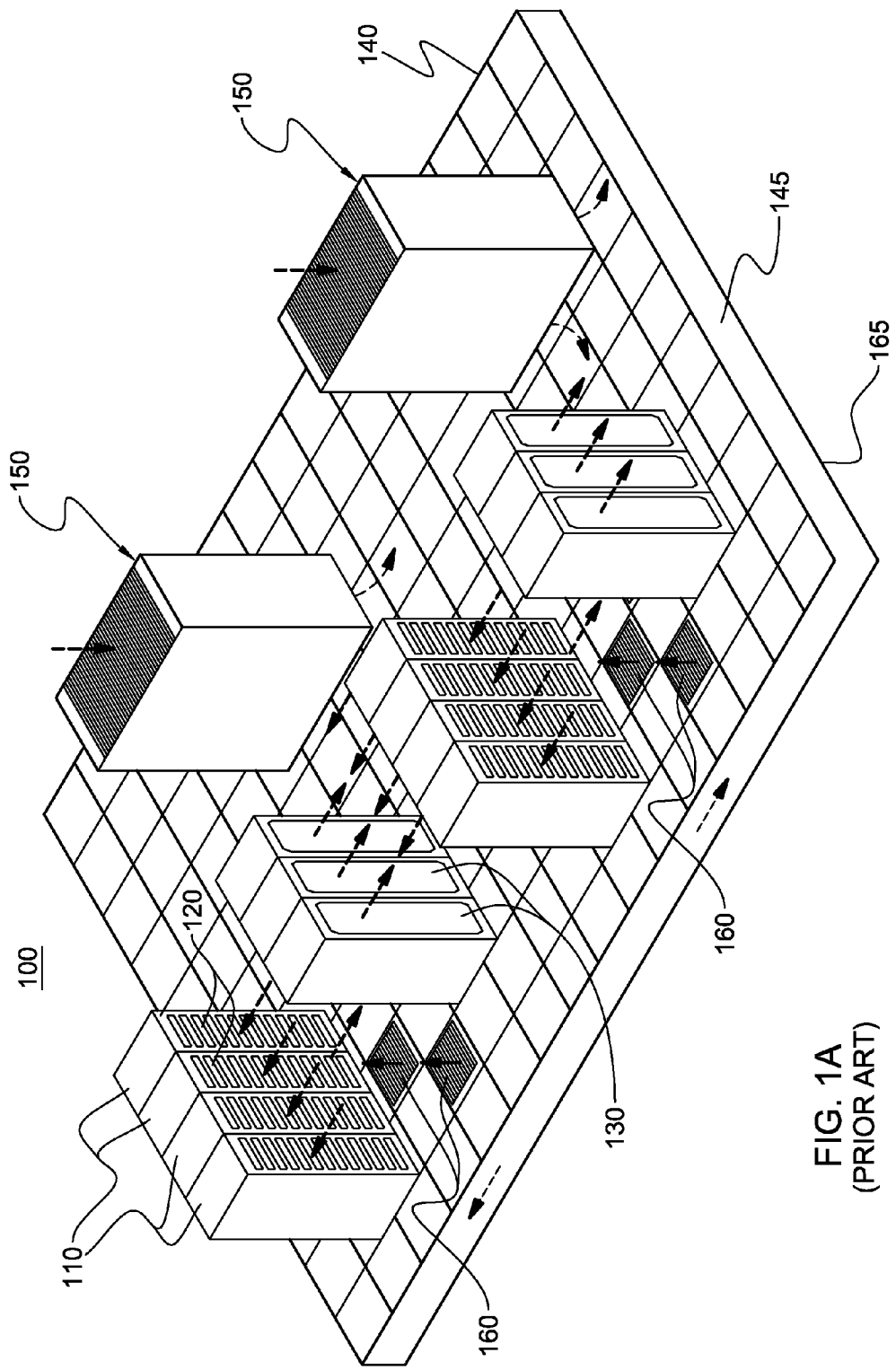
FIG. 1A depicts one embodiment of a conventional raised floor layout of an air cooled computer installation.

As shown in FIG. 1A, in a raised floor layout of an air cooled computer installation 100 typical in the prior art, multiple electronics racks 110 are disposed in one or more rows. A computer installation such as depicted in FIG. 1A may house several hundred, or even several thousand microprocessors. In the arrangement of FIG. 1A, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" aisles of the computer installation defined by opposing air outlet sides 130 of the electronics racks 110.

Figure 1B:
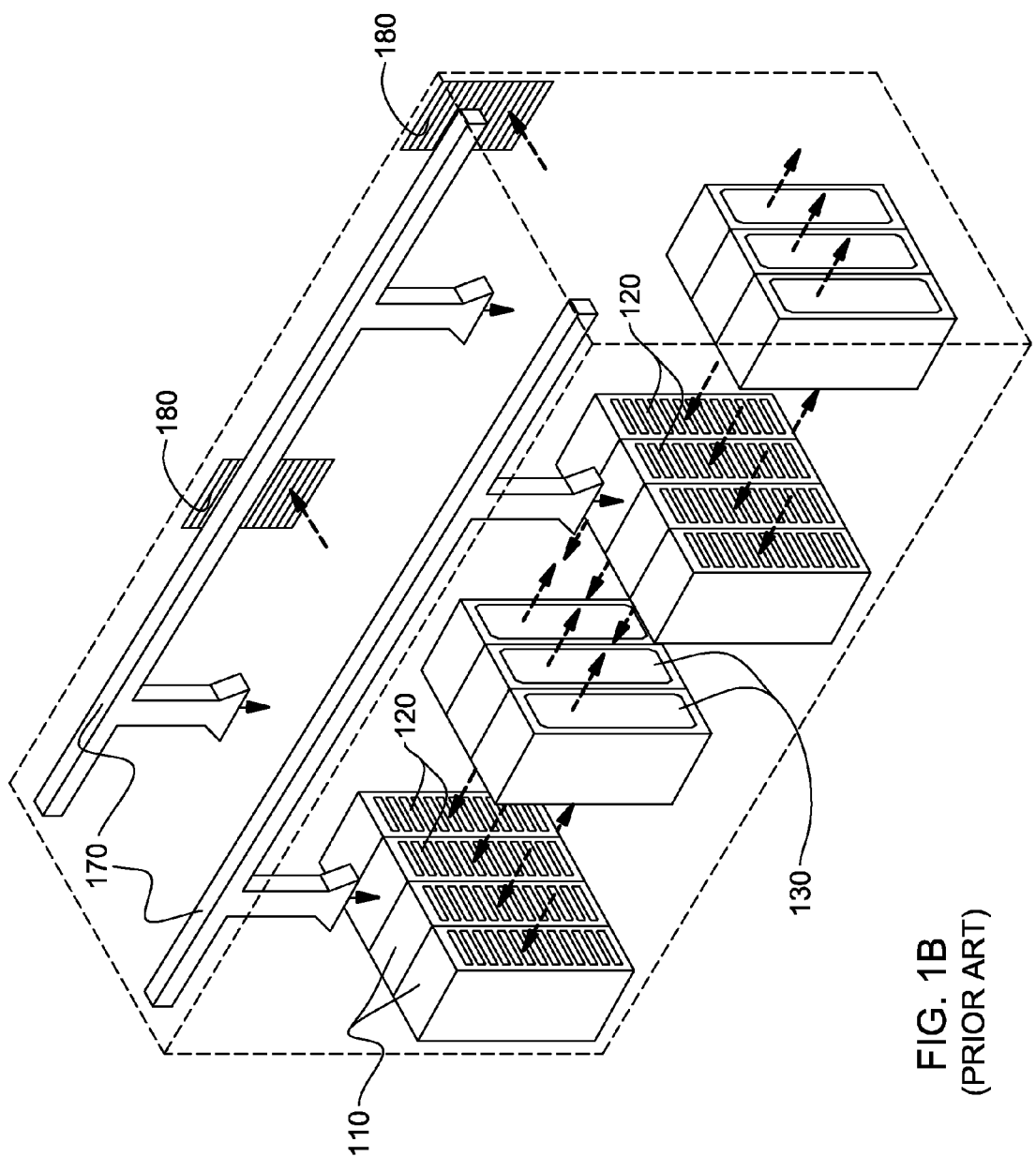
FIG. 1B depicts one embodiment of a conventional non-raised floor layout of an air cooled computer installation, wherein overhead air ducts and diffusers are employed in distributing cooled air flow to the electronics racks.

FIG. 1B depicts an alternate computer room configuration wherein multiple electronics racks 110 disposed in rows are cooled via conditioned and cooled air entering the room from overhead ducts and diffusers 170. Air exits the room via vents 180 that may be placed at different locations within the room. The ducts and diffusers 170 are disposed so as to align to the cold aisle of the multiple rows and provide cooled air to the air inlet sides 120 of the electronics racks. Air moving devices within the racks move the cooled air through the racks from their inlet-to-outlet sides to cool the heat generating components therein. Heated air is again exhausted at the hot aisles of the racks through the air outlet sides 130 of electronics racks 110. In one embodiment, returns 180 can be aligned to the hot aisles defined by the opposing air outlet sides 130 of the electronics racks.

Figure 2:
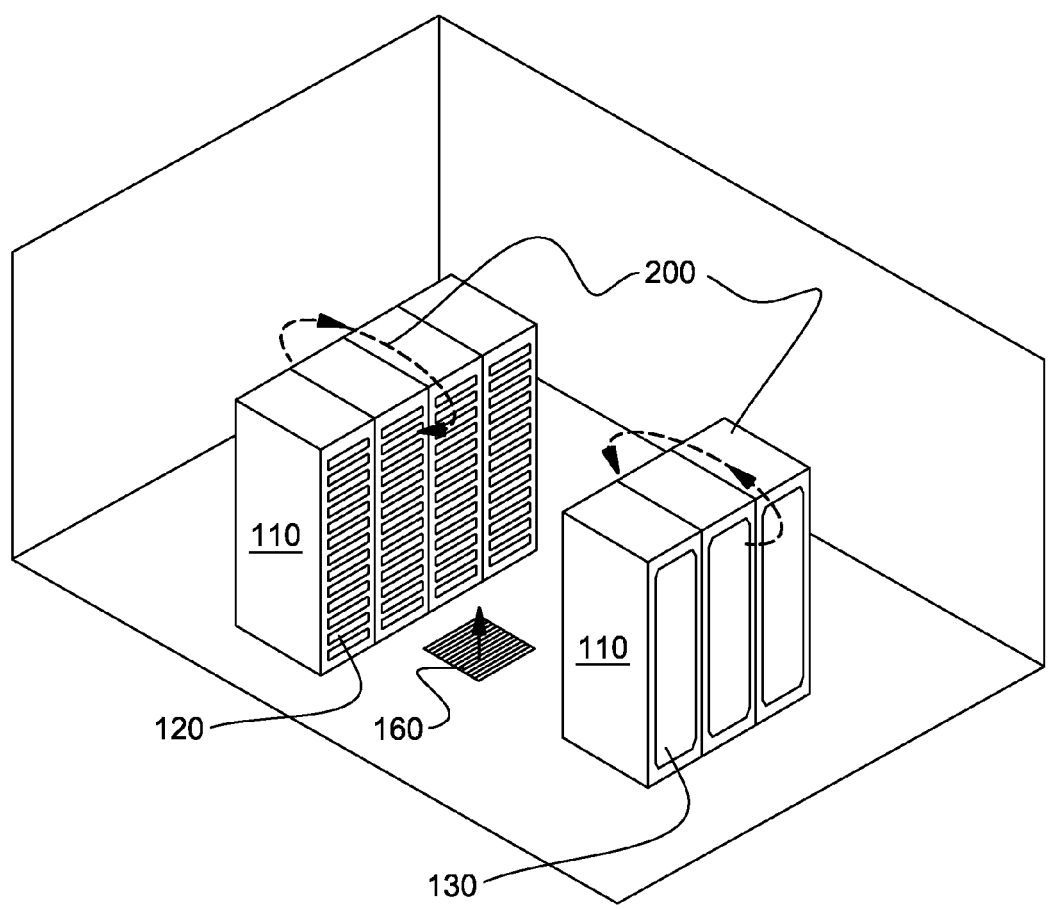
FIG. 2 depicts one problem addressed by the present invention, showing re-circulation air flow patterns in one implementation of a raised floor layout of an air cooled computer installation.

Due to the ever increasing air flow requirements through electronics racks, and limits of air distribution within the typical computer room installation, re-circulation problems within the room may occur. This is shown in FIG. 2 for a raised floor layout, wherein hot air re-circulation 200 occurs from the air outlet sides 130 of the electronics racks back to the cold air aisle defined by the opposing air inlet sides 120 of the electronics rack. This re-circulation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This re-circulating flow is often very complex in nature, and can lead to significantly higher rack unit inlet temperatures than might be expected.

The re-circulation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1A, however, temperatures can range from 15-20° C. at the lower portion of the rack, close to the cooled air input floor vents, to as much as 45-50° C. at the upper portion of the electronics rack, where the hot air can form a self-sustaining re-circulation loop. Since the allowable rack heat load is limited by the rack inlet air temperature at the "hot" part, this temperature distribution correlates to a lower processing capacity. Also, computer installation equipment almost always represents a high capital investment to the customer. Thus, it is of significant importance, from a product reliability and performance view point, and from a customer satisfaction and business perspective, to establish a substantially uniform temperature across the air inlet side of the rack unit. The efficient cooling of such computer and electronic systems, and the amelioration of localized hot air inlet temperatures to one or more rack units due to re-circulation of air currents, are addressed by the apparatuses and methods disclosed herein.

Figure 3A:
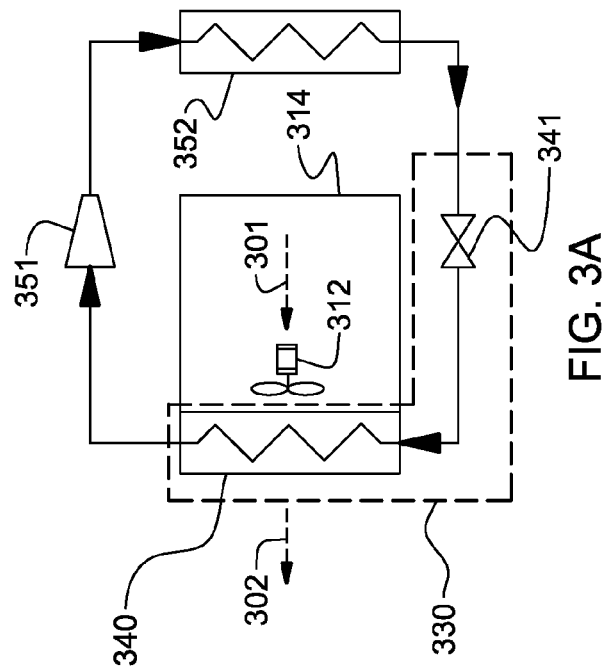
FIG. 3A is an operational schematic of the vapor-compression heat exchange system and electronics rack of FIG. 3, in accordance with an aspect of the present invention.
Figure 3:
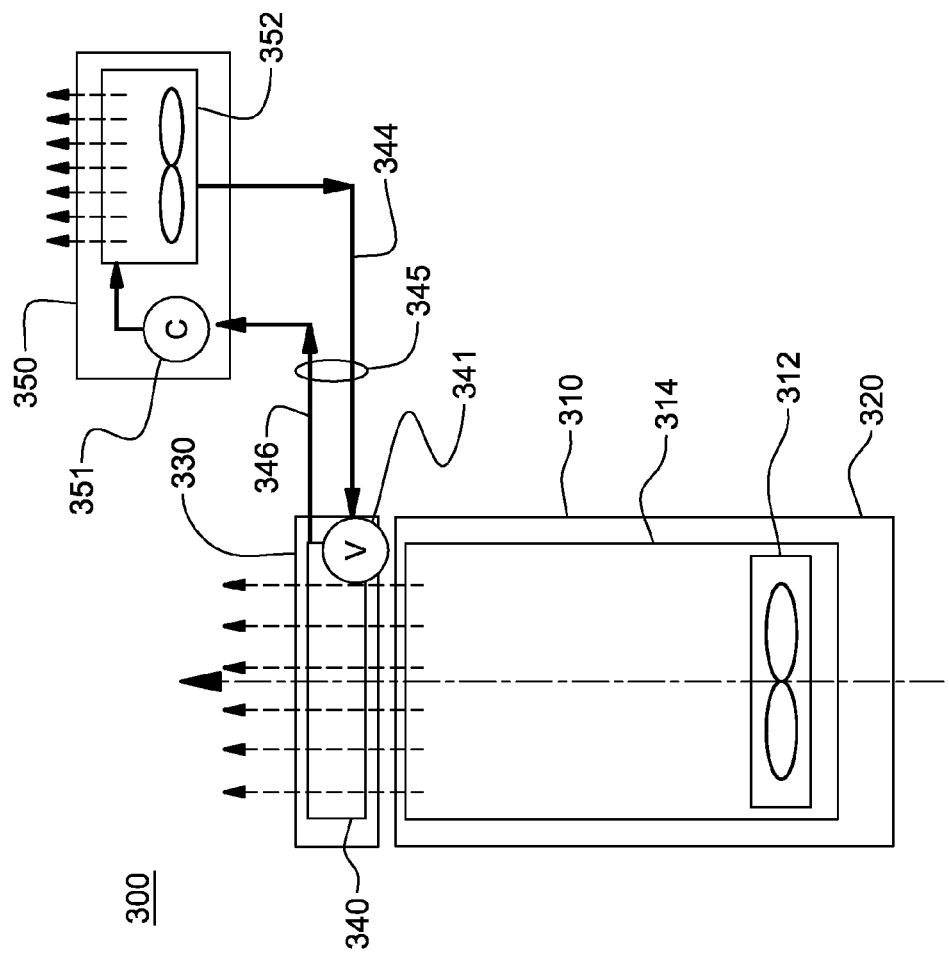
FIG. 3 is a top plan view of one embodiment of an electronics rack with a vapor-compression heat exchange system operatively coupled thereto, in accordance with an aspect of the present invention.

FIG. 3 depicts one embodiment of a cooled electronics system, generally denoted 300, in accordance with an aspect of the present invention. In this embodiment, electronics system 300 includes an electronics rack 310 having an inlet door cover 320 and an outlet door cover 330, which have openings to allow for the ingress and egress of external air from the inlet side to the outlet side of electronics rack 310. The system further includes at least one air-moving device 312 for moving external air across at least one electronics subsystem 314 positioned within the electronics rack. Disposed within outlet door cover 330 is an evaporator coil 340 of a vapor-compression heat exchange system comprising evaporator coil 340, vapor-compression unit 350 and at least one expansion valve 341. As shown, expansion valve 341 also resides within outlet door cover 330. Evaporator coil 340 removes heat from the exhausted inlet-to-outlet air flow through the electronics rack for transfer via the refrigerant to vapor-compression unit 350 where, in the embodiment of FIG. 3, heat is exhausted from the refrigerant via a compressor 351 and an air-cooled condenser 352 of the vapor-compression unit 350. A coolant loop 345 between evaporator coil 340 and vapor-compression unit 350 is defined by a first refrigerant line 344 connecting in fluid communication condenser 352 and evaporator coil 340 (via an inlet plenum discussed below), and a second refrigerant line 346 connecting in fluid communication evaporator coil 340 (via an outlet plenum discussed below) and compressor 351 of vapor-compression unit 350. Because the vapor-compression heat exchange system is refrigerant-based, refrigerant lines 344, 346 may advantageously be relatively long, for example, up to 150 meters in length, allowing vapor-compression unit 350 to reside within the data center housing the electronics rack 310 or outside of the data center. In the air-cooled vapor-compression unit implementation of FIG. 3, disposition of the vapor-compression unit outside the data center will advantageously reduce acoustic noise within the data center.

FIG. 3A is an operational schematic of the vapor-compression heat exchange system and electronics rack of FIG. 3. The vapor-compression heat exchange system uses a circulating liquid refrigerant as the medium which absorbs and removes heat from air egressing from the electronics rack, and subsequently rejects the heat via the vapor-compression unit. Circulating refrigerant enters compressor 351 in the thermodynamic state known as a saturated vapor and is compressed to a higher pressure, resulting in a higher temperature as well. The hot, compressed vapor is then in the thermodynamic state known as a super-heated vapor and it is at a temperature and pressure at which it can be condensed with typically available cooling water or cooling air. The hot vapor is routed through condenser 352 where it is cooled and condensed into a liquid by flowing through a coil or tubes with cool water or cool air flowing across the coil or tubes. This is where the circulating refrigerant rejects heat from the system and the rejected heat is carried away by either the water or the air, depending on the vapor-compression unit implementation.

The condensed liquid refrigerant, in the thermodynamic state known as a saturated liquid, is next routed through expansion valve 341, which as noted above in connection with FIG. 3, is disposed within the outlet door cover 330 (which also contains evaporator coil 340). Passing through expansion valve 341, the refrigerant undergoes an abrupt reduction in pressure. This pressure reduction results in the adiabatic flash evaporation of a part of the liquid refrigerant. The auto-refrigeration effect of adiabatic flash evaporation further lowers the temperature of the liquid and vapor refrigerant mixture. The cold mixture is then routed through the evaporator coil, which in one embodiment, may comprise one or more discrete heat exchange tube sections, as explained further below. Fan 312 establishes a warm air flow 301 egressing from the electronics subsystem 314 to be cooled. This warm air is cooled by the refrigerant passing through evaporator coil 340, with cooled air 302 egressing from the evaporator coil. The warm air passing across the evaporator coil evaporates the liquid part of the cold refrigerant mixture within the evaporator coil. At the same time, the circulating air is cooled, thus lowering the temperature of the air egressing from the evaporator coil. The evaporator coils is thus where the circulating refrigerant absorbs and removes heat, which is subsequently rejected in the condenser and transferred elsewhere by the water or air used in the condenser. The refrigeration cycle then repeats, with the refrigerant vapor from the evaporator being routed back to the compressor.

Figure 4:
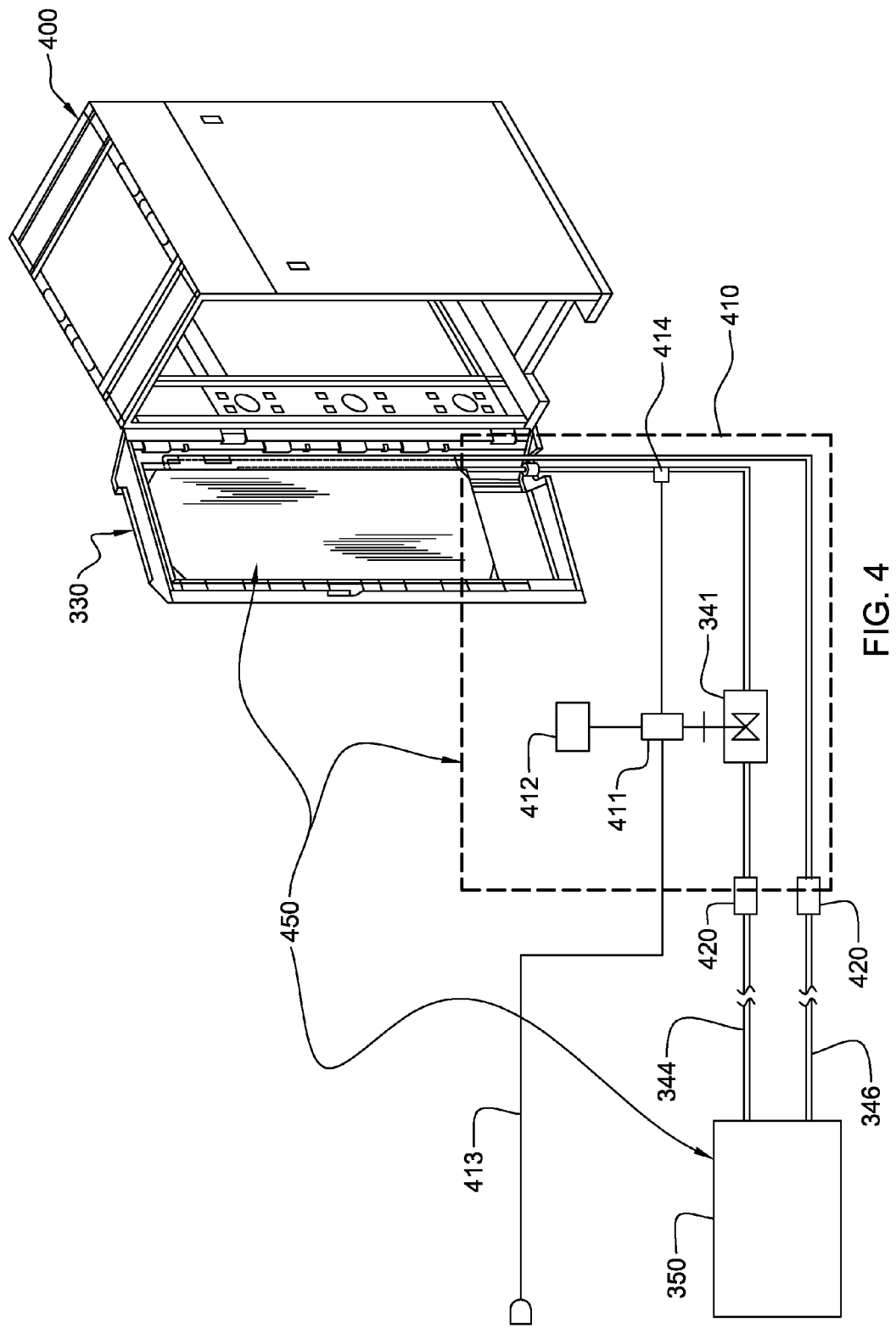
FIG. 4 is an isometric view of one embodiment of an electronics rack frame, outlet door cover, and vapor-compression heat exchange system, in accordance with an aspect of the present invention.

FIG. 4 depicts further details of one embodiment of an electronics rack frame 400, outlet door cover 330 hingedly mounted thereto, and a vapor-compression heat exchange system 450, in accordance with an aspect of the invention disclosed herein. In this embodiment, the evaporator coil is configured to reside within and cover an opening (not shown) in outlet door cover 330. Further, outlet door cover 330 is assumed to be (in one implementation) a modified outlet door cover. This modified outlet door cover is designed to replace an existing acoustical outlet door cover (not shown) of the electronics rack, in which case the modified outlet door cover and evaporator coil disclosed herein may be retrofitted to an existing electronics rack within a conventional data center. As explained further below, one feature of the present invention is that air flow impedance through the modified outlet door cover and evaporator coil mounted thereto is less than or equal to air flow impedance through the existing outlet door cover of the electronics rack. This is achieved, in one aspect, by designing the evaporator coil to balance air flow impedance through the evaporator coil with air-to-liquid heat exchange efficiency of the system. By trading off heat exchange efficiency, air flow impedance through the evaporator coil can be controlled. This advantageously allows use of an evaporator coil such as disclosed herein, without requiring additional air-moving devices within the electronics rack or associated with the evaporator coil to achieve the desired goal of alleviating heat load on the computer room air-conditioning units.

Figure 5:
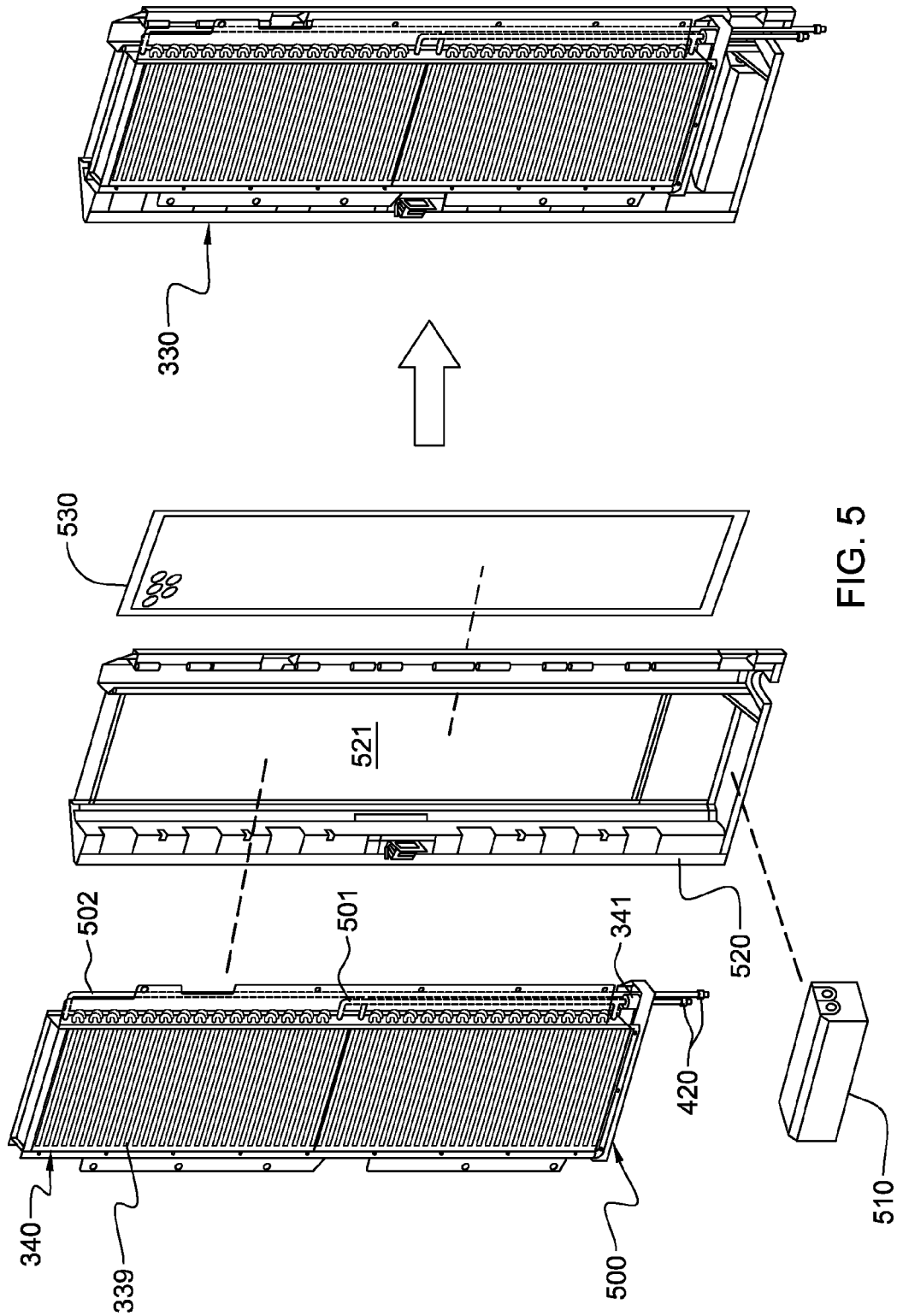
FIG. 5 is a partially exploded isometric view of one embodiment of an outlet door cover, including an evaporator coil, inlet and outlet plenums, and an expansion valve of a vapor-compression heat exchange system, in accordance with an aspect of the present invention.

As shown as exploded components 410 in FIG. 4, heat exchange system 450 includes, in addition to the evaporator coil, a control board 411 and a remote controller 412 coupled to refrigerant control or expansion valve 341. In one embodiment, components 410, including the controller and control board, are disposed within outlet door cover 330, for example, in a lower portion thereof as depicted in FIG. 5. Components 410 also include connect couplings 420, which in one embodiment, are disposed adjacent to the edge of the outlet door cover configured to hingedly mount to the electronics rack. These connect couplings may be any one of various types of commercially available couplings. For example, mechanical flare connections may be employed as connect couplings 420.

Advantageously, because the vapor-compression heat exchange system is refrigerant-based, piping 344, 346 runs the majority of the distance between vapor-compression unit 350 and connect couplings 420 (mounted to outlet door cover 330) and may be relatively long, fixed plumbing. For example, copper tubing could be employed with a length up to 150 meters between vapor-compression unit 350 and couplings 420 disposed at or near outlet door cover 330. Within one embodiment, flexible stainless steel hosing (not shown), may be employed to couple the fixed piping 344, 346 to the connect couplings 420. These flexible hoses would allow for rotational movement of the outlet door cover about the hinge access, and the size of the flexible hoses may be relative small, for example, on the order of one to three meters. Thus, the amount of flexible hosing required to circulate the refrigerant within the vapor compression heat exchange system is minimized, thereby providing greater reliability.

A power line 413 for control board 411 is also provided, which also powers a temperature sensor 414 disposed, for example, in communication with a refrigerant inlet plenum (discussed below) to maintain temperature of the refrigerant passing through the evaporator coil at, for example, 18° C.+/−1° C. By maintaining the refrigerant at a desired set point above the room dew point temperature, latent heat can be removed from egressing air at the air outlet side of the electronics rack without generating condensation on the evaporator coil. Further, the vapor-compression heat exchange system disclosed herein advantageously enables local air-cooling of air exiting an electronics rack as a supplemental rack-cooling solution in a high density data center, without requiring any chilled building facility water or other water cooling of the electronics rack, thus avoiding the possibility of water leakage from the cooling system(s).

Figure 6:
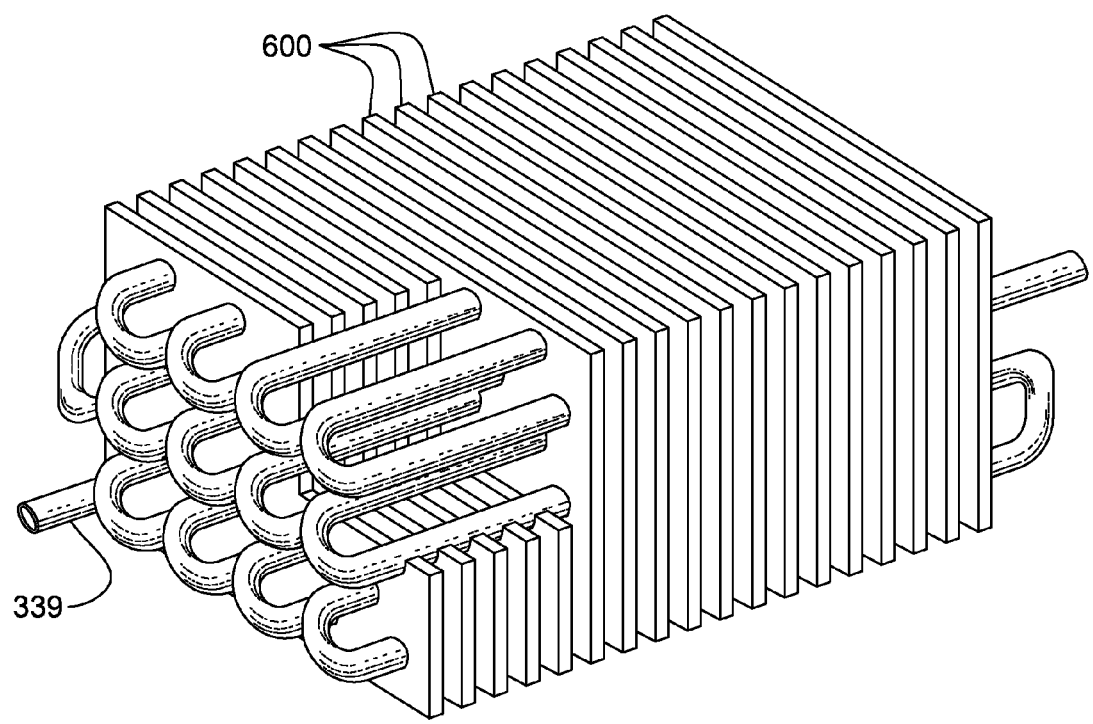
FIG. 6 is a partially cut-away, partial isometric view of one embodiment of an evaporator coil comprising a plurality of fins surrounding and extending from a core tube section, in accordance with an aspect of the present invention.

FIG. 5 depicts additional details of one embodiment of an outlet door cover and evaporator coil of a vapor-compression heat exchange system, in accordance with the invention disclosed herein. As shown at the left portion of the figure, an evaporator coil 340 includes an evaporator tube 339, which in one embodiment, may have a plurality of fins (see FIG. 6) projecting from the evaporator tube. Depending upon the implementation, evaporator tube 339 may comprise a single, serpentine channel, or a plurality of discrete heat exchange tube sections coupled together via inlet and outlet plenums 501, 502 disposed at the edge of the outlet door cover configured to hingedly mount to the electronics rack at the air outlet side thereof. In one embodiment, two discrete heat exchange tube sections (e.g., an upper tube section and a lower tube section) are employed as the evaporator coil. As shown, the one or more heat exchange tube sections are sized to substantially cover the entire opening 521 in the frame 520 of the outlet door cover.

In the depicted embodiment, the evaporator coil's two heat exchange tube sections are fed refrigerant by refrigerant inlet plenum 501 and exhaust refrigerant via refrigerant outlet plenum 502. In fluid communication with refrigerant inlet plenum 501 is one or more refrigerant expansion valves 341. For example, expansion valve 341 may be located between connect coupling 420 and the refrigerant inlet plenum 501, or multiple expansion valves could be disposed at the connections between the refrigerant inlet plenum and the individual heat exchange tube sections of the evaporator coil. Employing multiple expansion valves would facilitate separate control over the temperature of refrigerant passing through the different heat exchange tube sections. As noted, flexible hoses (not shown) may be employed for connecting to hard plumbing disposed near the electronics rack. These hoses would be brought into outlet door cover 330 adjacent to the hinge axis of the door.

In the embodiment of FIG. 5, a raised floor embodiment is assumed where hoses are routed through floor tile cut-outs (not shown) into outlet door cover 330 for connecting to connect couplings 420. In a non-raised floor environment, right angle adapters could be installed at the edge of each hose to allow the refrigerant to make a sharp turn at the base of the outlet door cover. The hoses are configured to plug into each manifold via industry standard, hydraulic, quick connect couplings. Once the hoses are plugged into the respective couplings and secured, the hoses (or adapters) rotate around each other as the outlet door cover 330 is pivoted open and closed, providing a minimum of movement to the hoses. (See FIGS. 7A & 7B.)

Continuing with FIG. 5, one embodiment of one perforated planar surface 530 is illustrated. First and second such perforated planar surfaces 530 would be provided for covering first and second main sides of the evaporator coil. In one embodiment, the perforated planar surfaces comprise metal plates having appropriate air flow openings to allow inlet-to-outlet air flow through the electronics rack to readily pass through the evaporator coil. One embodiment of air flow openings in the perforated planar surfaces is depicted in FIG. 5. In this embodiment, each perforated planar surface has a plurality of openings disposed throughout the plate. As one example, these openings may comprise hexagon-shaped openings which maximize air flow through the perforated surfaces, while still providing the desired isolation of the evaporator coil.

Each heat exchange tube section illustrated in FIG. 5 may comprise at least one of a continuous tube or multiple tubes connected together to form one continuous serpentine cooling channel. In the embodiment shown, each heat exchange tube section is a continuous tube having a first diameter, and each plenum 501, 502, is a tube having a second diameter, wherein the second diameter is greater than the first diameter. The first and second diameters are chosen to ensure adequate supply of refrigerant flow through the multiple tube sections.

In one embodiment, each heat exchange tube section may align to a respective electronics subsystem of the electronics rack.

Although not shown in FIG. 5, the heat exchange tube sections further include a plurality of fins (such as fins 600 in FIG. 6) extending from tube(s) 339 to facilitate heat transfer from air exhausted out the back of the electronics rack to refrigerant flowing through the serpentine cooling channels of the individual heat exchange tube sections. In one embodiment, the plurality of fins comprise aluminum fins extending from the individual tubes, which could be constructed of copper tubing. Further, in one implementation, the fins are brazed to the tubing. As explained above, the positioning, density, thickness and depth of the fins are selected to control air flow impedance through the resultant evaporator coil. Additionally, the number and diameter of tubes of the individual heat exchange tube sections, as well as the size, configuration and placement of the air flow openings in the first and second perforated planar surfaces are selected to control the overall air flow impedance through the evaporator coil. By so controlling the air flow impedance, the resultant heat exchange effectiveness of the evaporator coil is expected to be less than optimal. For example, a heat exchange effectiveness (defined as a ratio of heat removed by the evaporator coil to the heat dissipated within the electronics rack) of 50%-60% may be required in order to achieve a desired air flow impedance through the assembly. As noted, one design objective for the evaporator coil is that the coil, when mounted to the outlet door cover, has an air flow impedance which matches or is less than the air flow impedance of any existing rear door cover of an existing electronics rack installation to which the assembly is to be attached. By so matching, or reducing, the air flow impedance, the need for an additional air-moving device is avoided. By way of specific example, if an electronics rack has a total air flow of 1500 cfm (cubic feet per minute), and the pressure drop across the existing rear door cover at that air flow is 0.03 inches of water, then the evaporator coil is designed to have an air side pressure drop of less than or equal to 0.03 inches of water at 1500 cfm. Under this condition, the heat exchange effectiveness may be 50%-60%, but it is still more than adequate to alleviate heat load on the room air-conditioning unit(s) of a computer room installation. The materials and wall thickness are chosen to accommodate the air impedance design. Strict braze processing definition and control are employed along with multiple test points in the build process for robust, controlled component fabrication. In combination, these considerations contribute to and ensure a leak-proof, highly reliable product, which meets the design objectives.

Figure 7B:
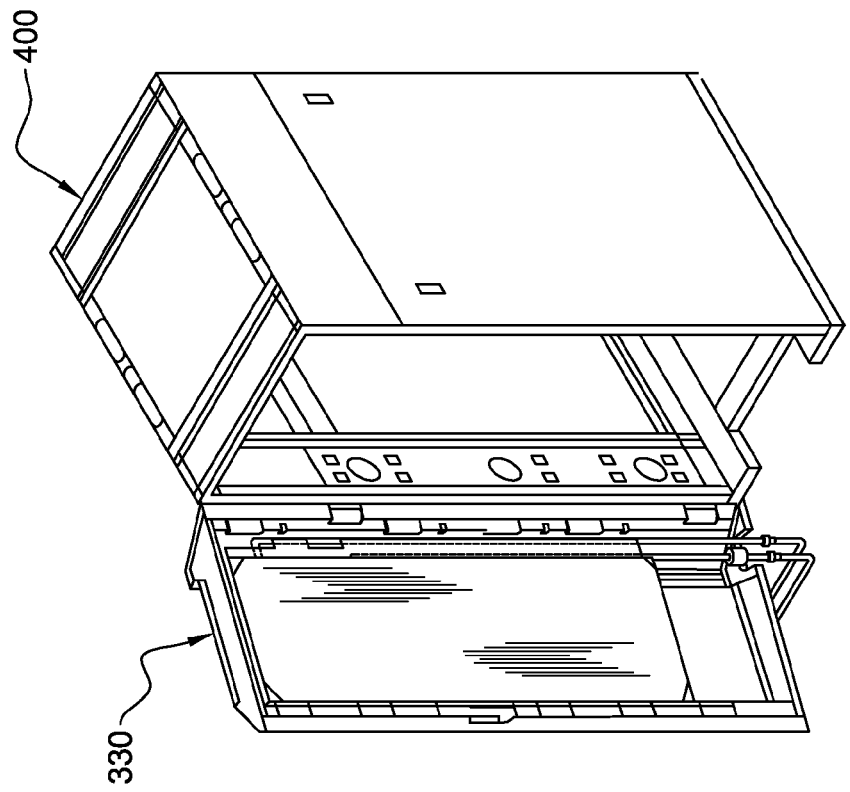
FIG. 7B is an isometric view of the structure of FIG. 7A, showing the outlet door cover, with the evaporator coil mounted therein, in an open position relative to the electronics frame, in accordance with an aspect of the present invention.
Figure 7A:
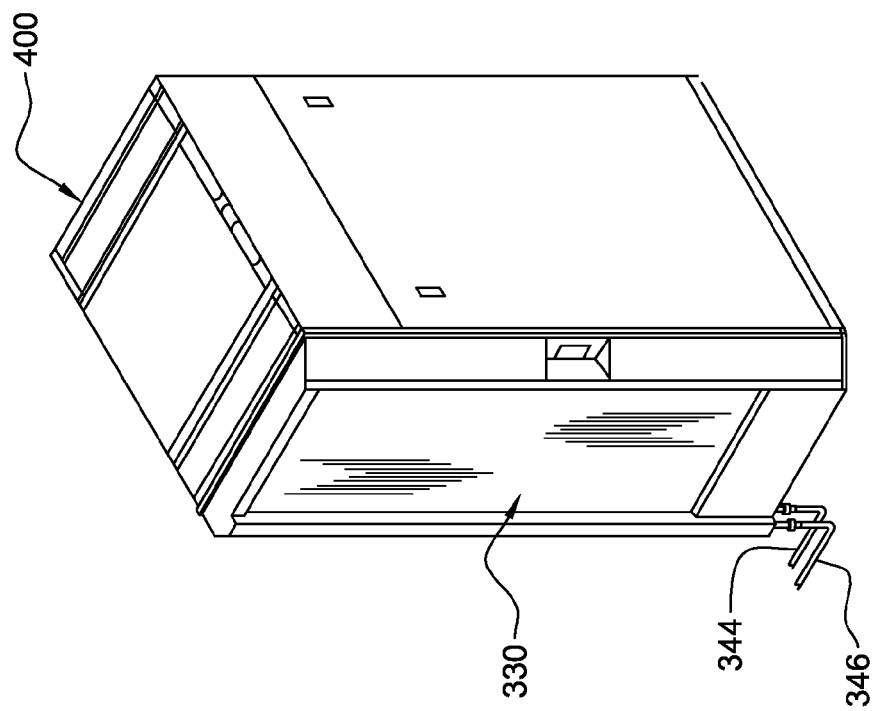
FIG. 7A is an isometric view of the partially assembled structure of FIG. 4, showing the evaporator coil mounted within the outlet door cover, and the outlet door cover hingedly secured to the electronics frame and in a closed position relative to the electronics frame, in accordance with an aspect of the present invention.

FIGS. 7A & 7B depict outlet door cover 330 in a closed position relative to electronics rack frame 400, and show tubing 344, 346 extending, for example, below a raised floor (not shown). In FIG. 7B, outlet door cover 330 is shown pivoted to an open position, allowing access to the air outlet side of the electronics rack frame 400.

Figure 8:
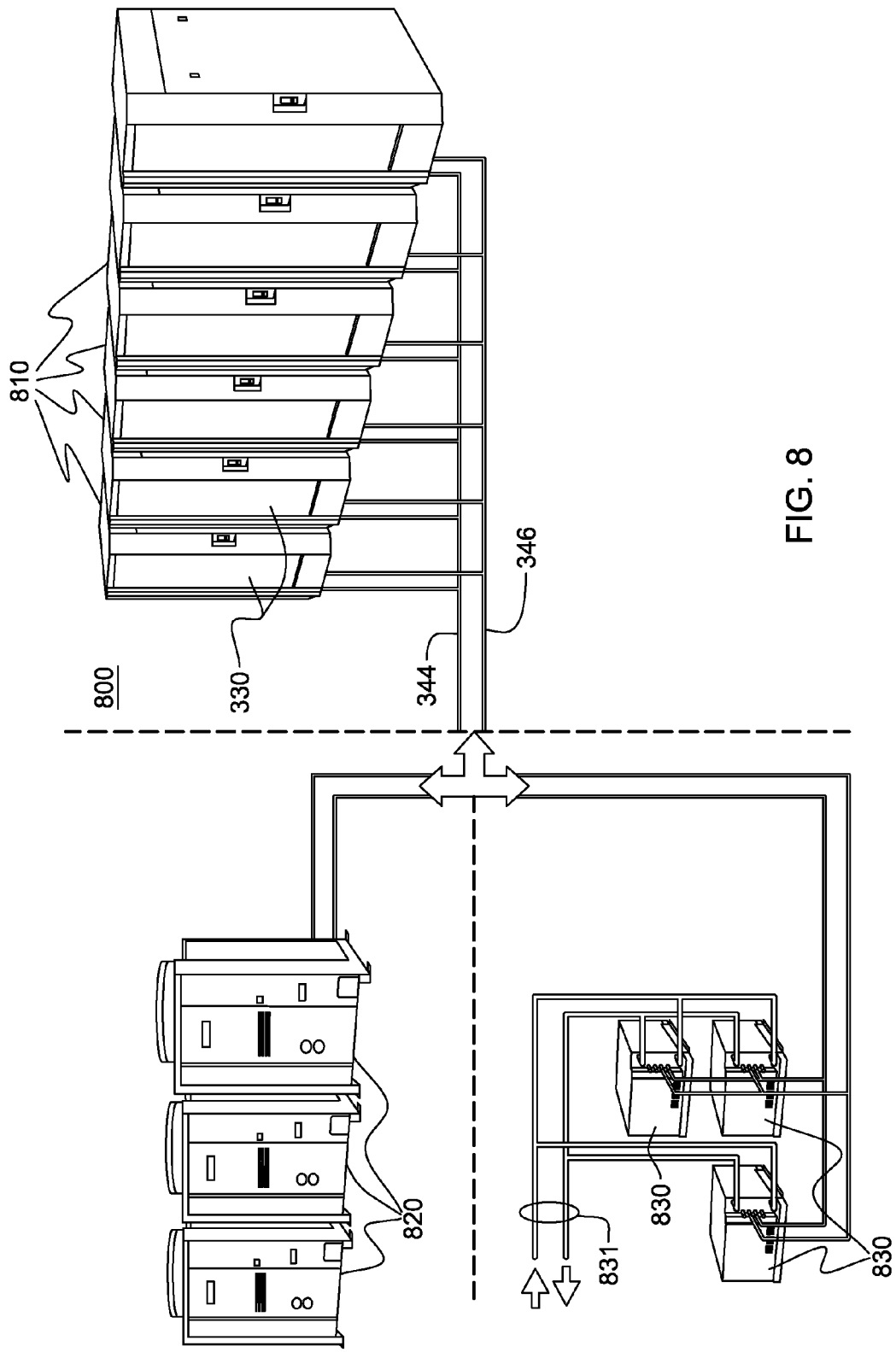
FIG. 8 depicts a data center with a plurality of electronics racks having evaporator coils of a vapor-compression heat exchange system mounted to the outlet door covers thereof, and cooled by refrigerant circulating therethrough and through one or more vapor-compression units disposed outside the data center, in accordance with an aspect of the present invention.

FIG. 8 depicts one implementation of a data center 800, having a plurality of electronics racks 810 aligned in a row. Each electronics rack again includes an outlet door cover 330, configured as described above in connection with FIGS. 4-7B. Piping 344, 346 caries refrigerant between the above-described heat exchange system components disposed within the outlet door covers and one or more vapor-compression units. In this figure, two alternate vapor-compression unit implementations are illustrated, both disposed outside data center 800. In one implementation, air-cooled outdoor vapor-compression units 820 are employed, wherein air cools the super-heated vapor passing through the condenser within the vapor-compression unit. In the alternate embodiment, a liquid, such as cold water, is employed in a facility cooling loop 831 to cool the super-heated vapor passing through the condenser within one or more vapor-compression units 830.

Advantageously, a plurality of electronics racks 810 are shown to be cooled employing one or more vapor-compression units. In the embodiment illustrated, three vapor-compression units are employed to cool air egressing from six electronics racks within the data center. By disposing the vapor-compression units outside the data center, improved acoustics within the data center are achieved, that is, compared with removing the same amount of heat with conventional room air-conditioning units.

Figure 9:
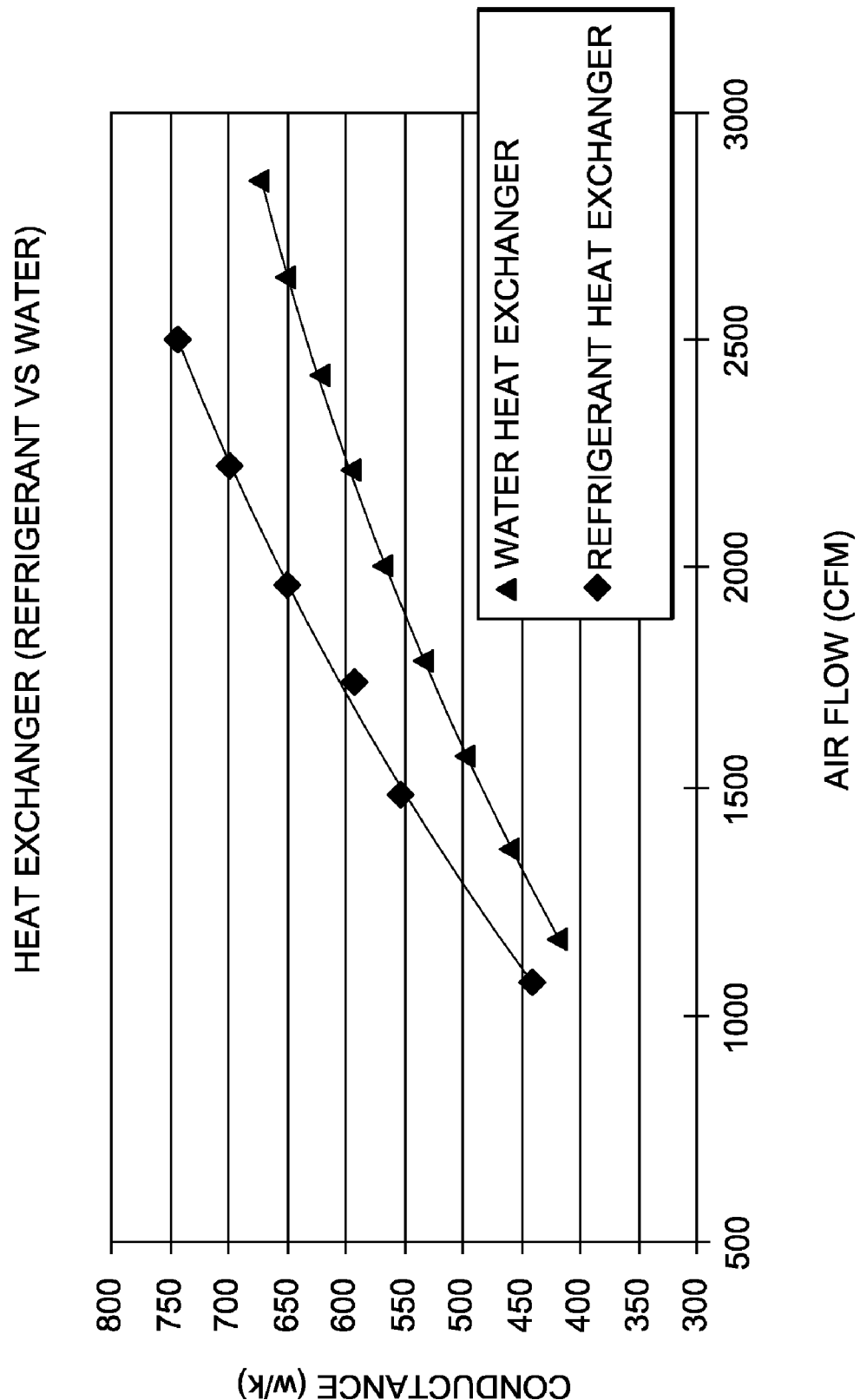
FIG. 9 graphically depicts cooling performance of a water-cooled heat exchange assembly mounted to an outlet door of an electronics rack compared with cooling performance of a vapor-compression heat exchange system with an evaporator coil mounted to the outlet door, in accordance with an aspect of the present invention.

FIG. 9 is a graph of cooling performance, wherein a vapor-compression heat exchange system is compared with a water based heat exchange system, with the heat exchangers of both systems being mounted to the outlet door cover of an electronics rack. As illustrated in FIG. 9, the use of a refrigerant provides approximately 10% better performance compared with a water based implementation at 1500 cfm air flow volume.

Figure 10:
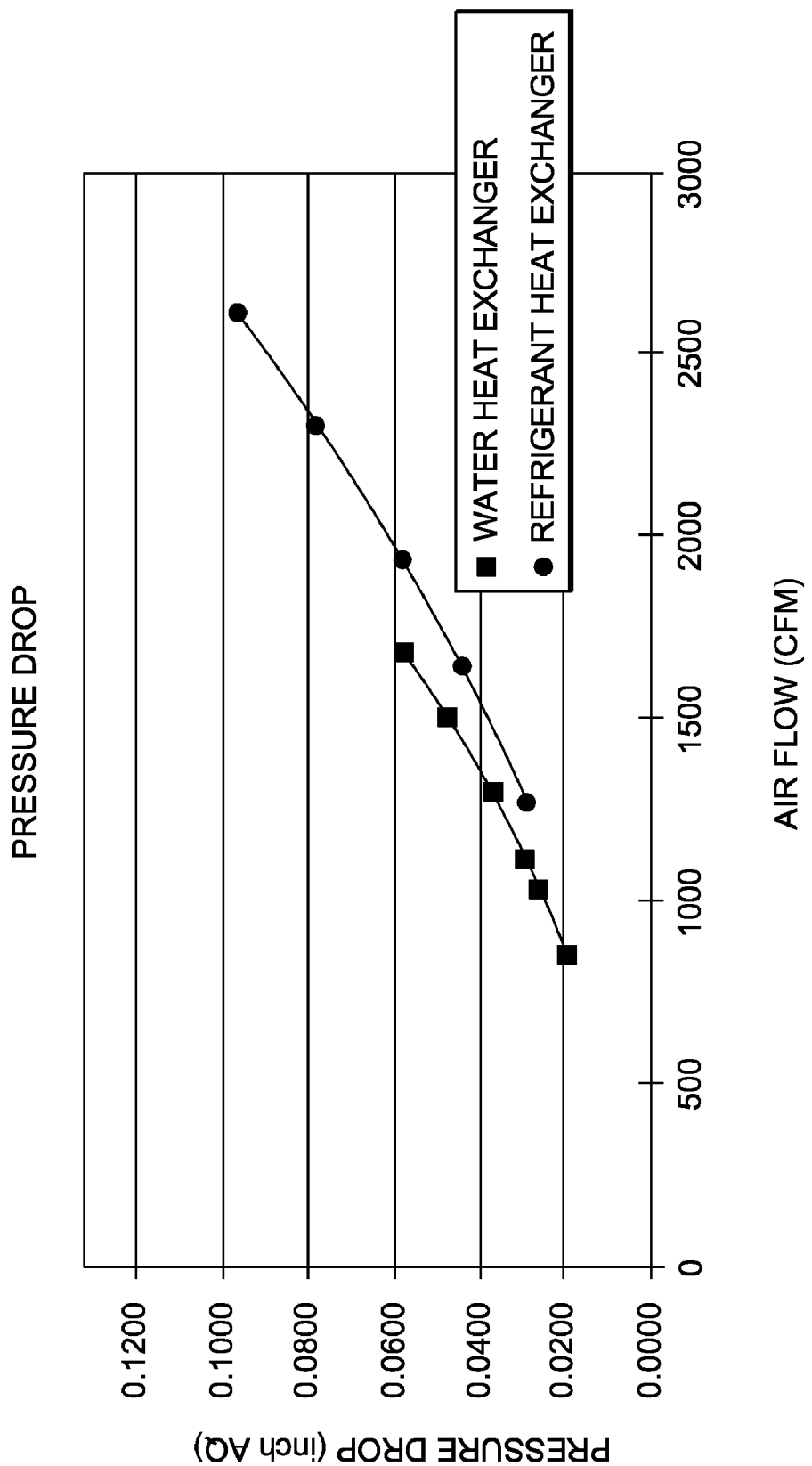
FIG. 10 is a graph of pressure drop through an outlet door cover of an electronics rack employing an evaporator coil of a vapor-compression heat exchange system compared to an air-to-liquid heat exchanger of a water-based heat exchange assembly, in accordance with an aspect of the present invention.

As shown in FIG. 10, this increased performance can be achieved while still reducing the air pressure drop of a refrigerant evaporator coil compared with a water-based heat exchanger at 1500 cfm airflow volume.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronics rack, the apparatus comprising:
    a vapor-compression heat exchange system mounted in part to an outlet door of an electronics rack, wherein air moves through the electronics rack from an air inlet side to an air outlet side thereof and the outlet door is configured to hingedly mount along one edge to the electronics rack at the air outlet side of the electronics rack, and wherein the vapor-compression heat exchange system comprises:
        an evaporator coil mounted to the outlet door, the evaporator coil being configured to cover at least a portion of an opening in the outlet door, and at least a portion of air moving through the electronics rack from the air inlet side to the air outlet side passing across the evaporator coil before exhausting from the electronics rack through the opening in the outlet door;
        a refrigerant inlet plenum and a refrigerant outlet plenum disposed adjacent to the edge of the outlet door configured to hingedly mount to the electronics rack, wherein the refrigerant inlet plenum and the refrigerant outlet plenum are each in fluid communication with a respective connect coupling of the vapor-compression heat exchange system, and wherein the evaporator coil further comprises at least one heat exchange tube section and a plurality of fins extending from the at least one heat exchange tube section, and wherein the refrigerant inlet plenum and the refrigerant outlet plenum are each in fluid communication with the at least one heat exchange tube section;
        an expansion valve in fluid communication with the refrigerant inlet plenum and mounted to the outlet door; and
        a vapor-compression unit comprising a compressor and a condenser disposed separate from the outlet door, the vapor-compression unit being coupled in fluid communication with the refrigerant inlet plenum, expansion valve, evaporator coil and refrigerant outlet plenum mounted to the outlet door for exhausting heat from refrigerant circulating therethrough.

2. The apparatus of claim 1, wherein the evaporator coil comprises a serpentine refrigerant channel defined at least in part by the at least one heat exchange tube section, and wherein the evaporator coil is mounted to the outlet door to reside within and pivot therewith, and to cover the opening in the outlet door, and wherein the apparatus further comprises a first perforated planar surface covering a first main side of the evaporator coil and a second perforated planar surface covering a second main side of the evaporator coil, each perforated planar surface containing airflow openings to allow inlet-to-outlet airflow through the electronics rack to pass through the first and second perforated planar surfaces and the evaporator coil of the vapor-compression heat exchange system.

3. The apparatus of claim 1, further comprising a controller mounted within the outlet door and in communication with the expansion valve for controlling operation of the expansion valve, wherein the controller controls temperature of refrigerant flowing through the evaporator coil by controlling operation of the expansion valve.

4. The apparatus of claim 3, wherein the controller controls the expansion valve to maintain temperature of refrigerant passing through the evaporator coil above ambient dew point of a data center housing the electronics rack.

5. The apparatus of claim 3, further comprising a drip pan mounted to the outlet door below the evaporator coil and above the controller for collecting condensate dripping from the evaporator coil.

6. The apparatus of claim 1, wherein the vapor compression unit is configured for disposition outside a data center containing the electronics rack, and wherein the condenser of the vapor compression unit is one of an air-cooled condenser unit or a liquid-cooled condenser unit.

7. The apparatus of claim 1, wherein the expansion valve is disposed adjacent to the edge of the outlet door configured to hingedly mount to the electronics rack, and wherein the apparatus further comprises a temperature sensor disposed within the outlet door for monitoring temperature of refrigerant passing through the evaporator coil, and a controller mounted within the outlet door and in communication with the expansion valve for controlling operation of the expansion valve, wherein the controller is coupled to the temperature sensor and controls via the expansion valve temperature of refrigerant flowing through the evaporator coil to a temperature above ambient dew point of a data center housing the electronics rack.

8. The apparatus of claim 1, wherein the outlet door, the electronics rack, the refrigerant inlet plenum, the expansion valve, the evaporator coil and the refrigerant outlet plenum are respectively a first outlet door, a first electronics rack, a first refrigerant inlet plenum, a first expansion valve, a first evaporator coil and a first refrigerant outlet plenum, and wherein the vapor-compression heat exchange system is mounted in part to a second outlet door of a second electronics rack, the vapor-compression heat exchange system further comprising:
    a second evaporator coil mounted to the second outlet door, the second evaporator coil being configured to cover at least a portion of an opening in the second outlet door, and at least a portion of air moving through the second electronics rack from the air inlet side to the air outlet side passing across the evaporator coil before exhausting from the second electronics rack through the opening in the second outlet door;

a second refrigerant inlet plenum and a second refrigerant outlet plenum disposed adjacent to an edge of the second outlet door hingedly mounted to the second electronics rack, wherein the second refrigerant inlet plenum and the second refrigerant outlet plenum are each in fluid communication with the respective connect coupling of the vapor-compression heat exchange system, the respective connect couplings also residing adjacent to the edge of the second outlet door hingedly mounted to the second electronics rack, and wherein the second evaporator coil further comprises at least one heat exchange tube section and a plurality of fins extending from the at least one heat exchange tube section, and wherein the second refrigerant inlet plenum and the second refrigerant outlet plenum are each in fluid communication with each heat exchange tube section of the at least one heat exchange tube section of the second evaporator coil;

a second expansion valve in fluid communication with the second refrigerant inlet plenum and mounted to the second outlet door; and wherein the vapor-compression unit is separate from the second outlet door and is in fluid communication with the second refrigerant inlet plenum, second expansion valve, second evaporator coil and second outlet plenum mounted to the second outlet door for exhausting heat from refrigerant circulating therethrough.

9. A cooled electronics system comprising:

an electronics rack, the electronics rack comprising:
- an air inlet side and an air outlet side, the air inlet and air outlet sides respectively enabling ingress and egress of external air;
- at least one electronics subsystem requiring cooling;
- at least one air-moving device, the at least one air-moving device being capable of causing external air to flow from the air inlet side of the electronics rack, across the at least one electronics subsystem to the air outlet side of the electronics rack; and
- an outlet door hingedly mounted along one edge to the electronics rack at the air outlet side of the electronics rack, the outlet door having an opening therein allowing egress of air from the electronics rack;

an apparatus for facilitating cooling of the electronics rack, the apparatus comprising:
- a vapor-compression heat exchange system mounted in part to the outlet door of the electronics rack, the vapor-compression heat exchange system comprising:
  - an evaporator coil mounted to the outlet door, the evaporator coil being configured to cover at least a portion of the opening in the outlet door, and at least a portion of air moving through the electronics rack from the air inlet side to the air outlet side passing across the evaporator coil before exhausting from the electronics rack through the opening in the outlet door:
  - a refrigerant inlet plenum and a refrigerant outlet plenum disposed adjacent to the edge of the outlet door hingedly mounted to the electronics rack, wherein the refrigerant inlet plenum and the refrigerant outlet plenum are each in fluid communication with a respective connect coupling of the vapor-compression heat exchange system, and wherein the evaporator coil further comprises at least one heat exchange tube section and a plurality of fins extending from the at least one heat exchange tube section, and wherein the refrigerant inlet plenum and the refrigerant outlet plenum are each in fluid communication with the at least one heat exchange tube section;
  - an expansion valve in fluid communication with the refrigerant inlet plenum and mounted to the outlet door; and
  - a vapor-compression unit comprising at compressor and a condenser disposed separate from the outlet door, the vapor-compression unit being coupled in fluid communication with the refrigerant inlet plenum, expansion valve, evaporator coil and refrigerant outlet plenum mounted to the outlet door for exhausting heat from refrigerant circulating therethrough.

10. The cooled electronics system of claim 9, wherein the evaporator coil comprises a serpentine refrigerant channel defined at least in part by the at least one heat exchange tube section, and wherein the evaporator coil is mounted to the outlet door to reside within and pivot therewith, and to cover the opening in the outlet door, and wherein the cooled electronics system further comprises a first perforated planar surface covering a first main side of the evaporator coil and second perforated planar surface covering a second main side of the evaporator coil, each performed planar surface containing airflow openings to allow inlet-to-outlet airflow through the electronics rack to pass through the first and second perforated planar surfaces and the evaporator coil of the vapor-compression heat exchange system.

11. The cooled electronics system of claim 9, further comprising a controller mounted within the outlet door and in communication with the expansion valve for controlling operation of the expansion valve, wherein the controller controls temperature of refrigerant flowing through the evaporator coil by controlling operation of the expansion valve.

12. The cooled electronics system of claim 11, wherein the controller controls the expansion valve to maintain temperature of refrigerant passing through the evaporator coil above ambient dew point of a data center housing the electronics rack.

13. The cooled electronics system of claim 11, further comprising a drip pan mounted to the outlet door below the evaporator coil and above the controller for collecting condensate dripping from the evaporator coil.

14. The cooled electronics system of claim 9, wherein the vapor compression unit is configured for disposition outside a data center containing the electronics rack, and wherein the condenser of the vapor compression unit is once of an air-cooled condenser unit or a liquid-cooled condenser unit.

15. The cooled electronics system of claim 9, wherein the expansion valve is disposed adjacent to the edge of the outlet door configured to hingedly mount to the electronics rack, and wherein the cooled electronics system further comprises a temperature sensor disposed within the outlet door for monitoring temperature of refrigerant passing through the evaporator coil, and a controller mounted within the outlet door and in communication with the expansion valve for controlling operation of the expansion valve, wherein the controller is coupled to the temperature sensor and controls via the expansion valve temperature of refrigerant flowing through the evaporator coil to a temperature above ambient dew point of a data center housing the electronics rack.

16. A data center comprising:

at least one electronics rack, each electronics rack comprising an air inlet side and an air outlet side, the air inlet and air outlet sides respectively enabling ingress and egress of air through the electronics rack, and each electronics rack further comprising an outlet door hingedly mounted along one edge to the electronics rack at the air outlet side thereof; and a vapor-compression heat exchange system mounted in part to at least one outlet door of the at least one electronics rack, the vapor-compression heat exchange system facilitating cooling of the at least one electronics rack, and comprising for each electronics rack of the at least one electronics rack:

an evaporator coil mounted to the outlet door thereof, the evaporator coil being configured to cover at least a portion of an opening in the outlet door, and at least a portion of air moving through the electronics rack from the air inlet side to the air outlet side passing across the evaporator coil before exhausting from the electronics rack through the opening in the outlet door;

a refrigerant inlet plenum and a refrigerant outlet plenum disposed adjacent to the edge of the outlet door hingedly mounted to the electronics rack, wherein the refrigerant inlet plenum and the refrigerant outlet plenum are each in fluid communication with a respective connect coupling of the vapor-compression heat exchange system, and wherein the evaporator coil further comprises at least one heat exchange tube section and a plurality of fins extending from the at least one heat exchange tube section, and wherein the refrigerant inlet plenum and the refrigerant outlet plenum are each in fluid communication with the at least one heat exchange tube section;

an expansion valve in fluid communication with the refrigerant inlet plenum and mounted to the outlet door; and wherein the vapor-compression heat exchange system further comprises a vapor-compression unit, comprising a compressor and a condenser, disposed separate from the at least one outlet door, the vapor-compression unit being in fluid communication with each refrigerant inlet plenum, expansion valve, evaporator coil, and outlet plenum mounted to the at least one outlet door of the at least one electronics rack by the respective connect couplings for exhausting heat from refrigerant circulating therethrough.

17. The data center of claim 16, wherein the evaporator coil comprises a serpentine refrigerant channel defined at least in part by the at least one heat exchange tube section, and wherein the evaporator coil is mounted to the outlet door to reside within and pivot therewith, and to cover the opening in the outlet door, and wherein the vapor-compression heat exchange system further comprises a first perforated planar surface covering a first main side of the evaporator coil and a second perforated planar surface covering a second main side of the evaporator coil, each perforated planar surface containing airflow openings to allow inlet-to-outlet airflow through the electronics rack to pass through the first and second perforated planar surfaces and the evaporator coil of the vapor-compression heat exchange system.

18. The data center of claim 16, wherein the expansion valve is disposed adjacent to the edge of the outlet door configured to hingedly mount to the electronics rack, and wherein the vapor-compression heat exchange system further comprises a temperature sensor disposed within the outlet door for monitoring temperature of refrigerant passing through the evaporator coil, and a controller mounted within the outlet door and in communication with the expansion valve for controlling operation of the expansion valve, wherein the controller is coupled to the temperature sensor and controls via the expansion valve temperature of refrigerant flowing through the evaporator coil to a temperature above ambient dew point of a data center housing the electronics rack.

19. The data center of claim 16, wherein the vapor compression unit is configured for disposition outside a data center containing the electronics rack, and wherein the condenser of the vapor compression unit is one of an air-cooled condenser unit or a liquid-cooled condenser unit.

20. The data center of claim 19, further comprising multiple electronics racks, and wherein the vapor-compression heat exchange system is mounted in part to multiple outlet doors of the multiple electronics racks, wherein the vapor-compression heat exchange system simultaneously cools air egressing from the air outlet sides of the multiple electronics racks when operational.

* * * * *